(12) United States Patent
Lee et al.

(10) Patent No.: US 10,240,236 B2
(45) Date of Patent: Mar. 26, 2019

(54) CLEAN RESISTANT WINDOWS FOR ULTRAVIOLET THERMAL PROCESSING

(71) Applicant: Lam Research Corporation, Fremont, CA (US)

(72) Inventors: James Lee, Damascus, OR (US); George Andrew Antonelli, Portland, OR (US); Kevin M. McLaughlin, Sherwood, OR (US); Andrew John McKerrow, Lake Oswego, OR (US); Curtis Bailey, West Linn, OR (US); Alexander R. Fox, Portland, OR (US); Stephen Lau, Lake Oswego, OR (US); Eugene Smargiassi, Tualatin, OR (US); Casey Holder, Tualatin, OR (US); Troy Daniel Ribaudo, Portland, OR (US); Xiaolan Chen, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 531 days.

(21) Appl. No.: 14/641,179

(22) Filed: Mar. 6, 2015

(65) Prior Publication Data
US 2016/0258057 A1  Sep. 8, 2016

(51) Int. Cl.
*B08B 7/00* (2006.01)
*B08B 9/00* (2006.01)
(Continued)

(52) U.S. Cl.
CPC .......... *C23C 16/488* (2013.01); *B08B 7/0057* (2013.01); *C23C 16/4405* (2013.01);
(Continued)

(58) Field of Classification Search
CPC ..... B08B 7/0057; B08B 9/00; C23C 16/4405; C23C 16/4408; C23C 16/4412;
(Continued)

(56) References Cited

U.S. PATENT DOCUMENTS

| 4,409,511 A | * | 10/1983 | Loda | ........................ | H05H 7/00 165/104.32 |
| 5,960,158 A | * | 9/1999 | Gat | ........................ | C30B 31/12 219/390 |

(Continued)

OTHER PUBLICATIONS

U.S. Appl. No. 14/546,990, filed Nov. 18, 2014, entitled "Reactive Ultraviolet Thermal Processing of Low Dielectric Constant Materials."

*Primary Examiner* — Benjamin Kendall
(74) *Attorney, Agent, or Firm* — Weaver Austin Villeneuve & Sampson LLP

(57) ABSTRACT

Apparatuses and methods for cleaning a semiconductor processing chamber is provided. The semiconductor processing chamber may include a UV radiation source, a substrate holder, and a UV transmissive window. The UV transmissive window may include one or multiple panes. One or more panes of the UV transmissive window may be non-reactive with fluorine containing chemistries. In multi-pane windows a purge gas flow path may be formed in the gap between windows. A purge gas may be flowed through the purge gas flow path to prevent process gases used in the chamber interior from reaching one or more panes of the UV transmissive window.

20 Claims, 10 Drawing Sheets

(51) Int. Cl.
    *C23C 16/44*     (2006.01)
    *C23C 16/48*     (2006.01)
    *H01L 21/67*     (2006.01)
    *H01L 21/687*     (2006.01)

(52) U.S. Cl.
    CPC ...... *C23C 16/4408* (2013.01); *H01L 21/6719* (2013.01); *H01L 21/67115* (2013.01); *H01L 21/68764* (2013.01); *H01L 21/68771* (2013.01); *B08B 9/00* (2013.01)

(58) Field of Classification Search
    CPC . C23C 16/45561; C23C 16/48; C23C 16/481; C23C 16/482; C23C 16/488; C23C 16/52; H01L 21/67069; H01L 21/67098; H01L 21/67109; H01L 21/67115; H01L 21/6719; H01L 21/68764; H01L 21/68771
    See application file for complete search history.

(56) References Cited

U.S. PATENT DOCUMENTS

| | | | |
|---|---|---|---|
| 6,048,798 A * | 4/2000 | Gadgil | H01J 37/32522 216/67 |
| 6,284,051 B1 * | 9/2001 | Fidelman | C23C 16/481 118/50.1 |
| 6,559,424 B2 * | 5/2003 | O'Carroll | C23C 16/481 118/50.1 |
| 6,941,063 B2 * | 9/2005 | Camm | C30B 31/12 118/724 |
| 7,094,713 B1 | 8/2006 | Niu et al. | |
| 7,115,837 B2 * | 10/2006 | Timans | F27B 17/0025 118/50.1 |
| 7,208,389 B1 | 4/2007 | Tipton et al. | |
| 7,253,125 B1 | 8/2007 | Bandyopadhyay et al. | |
| 7,265,061 B1 | 9/2007 | Cho et al. | |
| 7,327,948 B1 | 2/2008 | Shrinivasan et al. | |
| 7,510,982 B1 | 3/2009 | Draeger et al. | |
| 7,611,757 B1 | 11/2009 | Bandyopadhyay et al. | |
| 7,622,162 B1 | 11/2009 | Schravendijk et al. | |
| 7,790,633 B1 | 9/2010 | Tarafdar et al. | |
| 7,906,174 B1 | 3/2011 | Wu et al. | |
| 7,935,940 B1 | 5/2011 | Smargiassi | |
| 8,043,667 B1 | 10/2011 | Bandyopadhyay et al. | |
| 8,062,983 B1 | 11/2011 | Draeger et al. | |
| 8,137,465 B1 | 3/2012 | Shrinivasan et al. | |
| 8,211,510 B1 | 7/2012 | Varadarajan et al. | |
| 8,242,028 B1 | 8/2012 | van Schravendijk et al. | |
| 8,246,778 B2 | 8/2012 | Lu et al. | |
| 8,283,644 B2 | 10/2012 | Smargiassi et al. | |
| 8,398,816 B1 | 3/2013 | Gytri et al. | |
| 8,454,750 B1 | 6/2013 | Shrinivasan et al. | |
| 8,465,991 B2 | 6/2013 | Varadarajan et al. | |
| 8,512,818 B1 | 8/2013 | Varadarajan et al. | |
| 8,629,068 B1 | 1/2014 | Shrinivasan et al. | |
| 8,715,788 B1 | 5/2014 | Bandyopadhyay et al. | |
| 8,889,233 B1 | 11/2014 | Kelman et al. | |
| 8,951,348 B1 | 2/2015 | Shrinivasan et al. | |
| 8,980,769 B1 | 3/2015 | Haverkamp et al. | |
| 2002/0092471 A1 * | 7/2002 | Kang | C23C 16/455 118/715 |
| 2004/0084437 A1 * | 5/2004 | Timans | F27B 5/04 219/390 |
| 2009/0289053 A1 * | 11/2009 | Ranish | H01L 21/67115 219/522 |
| 2010/0074604 A1 * | 3/2010 | Koelmel | H01L 21/67098 392/408 |
| 2010/0267231 A1 | 10/2010 | Van Schravendijk et al. | |
| 2011/0111533 A1 | 5/2011 | Varadarajan et al. | |
| 2011/0117678 A1 | 5/2011 | Varadarajan et al. | |
| 2011/0146705 A1 * | 6/2011 | Hart | H01L 21/02041 134/2 |
| 2011/0155058 A1 * | 6/2011 | Carlson | C23C 16/46 118/722 |
| 2012/0161021 A1 | 6/2012 | Smargiassi et al. | |
| 2013/0284087 A1 | 10/2013 | Gytri et al. | |
| 2013/0288488 A1 * | 10/2013 | Wang | H01L 21/02041 438/795 |
| 2014/0053866 A1 * | 2/2014 | Baluja | C11D 11/0041 134/1.1 |
| 2014/0080324 A1 | 3/2014 | Shrinivasan et al. | |
| 2014/0094038 A1 | 4/2014 | Haverkamp et al. | |
| 2015/0056108 A1 | 2/2015 | Gytri et al. | |
| 2015/0361557 A1 * | 12/2015 | Ueda | H01L 21/67115 118/722 |

* cited by examiner

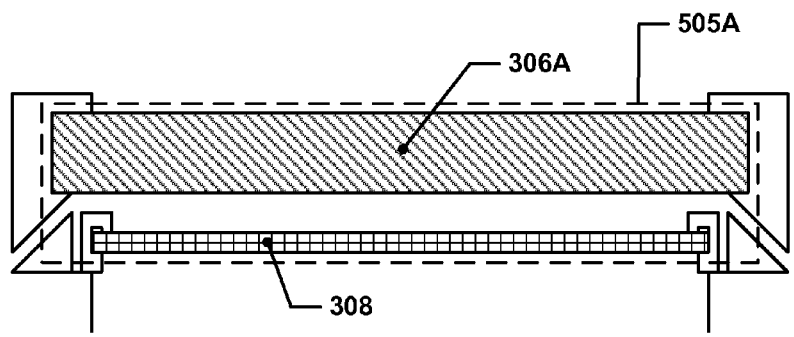
Figure 5A
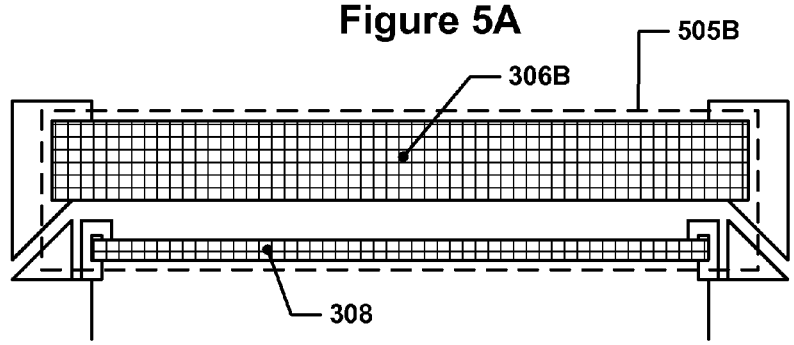
Figure 5B
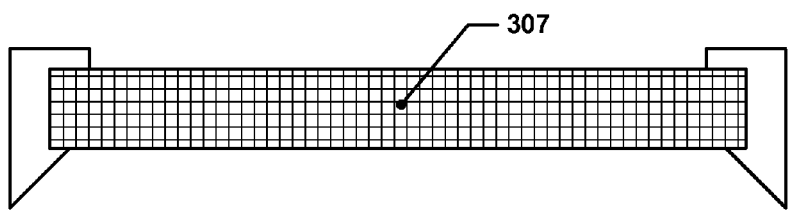
Figure 5C
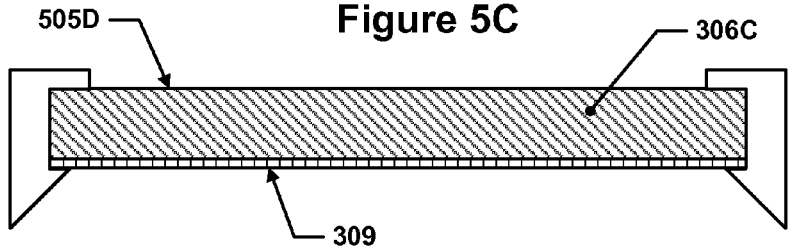
Figure 5D
 Material A
 Material B

CLEAN RESISTANT WINDOWS FOR ULTRAVIOLET THERMAL PROCESSING

BACKGROUND

During semiconductor substrate processing operations, solid residues of process chemistry tend to accumulate on the internal walls and surfaces of the reaction chamber. These residues can build up on the inside of the chamber and can dissolve, detach or otherwise disperse through the chamber during subsequent processing, resulting in substrate contamination and yield loss, or changes in chamber performance leading to a lack of wafer-to-wafer processing uniformity. Consequently, the residues that accumulate on the interior surfaces of the chamber are periodically removed. Removal chemistries must be both effective and compatible with the chamber materials in order not to damage chamber components. Organic residues may be cleaned with oxygen containing chemistries. However, silicon containing residues may require fluorine containing chemistries to clean. Certain chamber materials may be incompatible with certain chemistries. For example, quartz windows may be incompatible with fluorine containing chemistries.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In certain implementations, a semiconductor processing apparatus may be provided. The semiconductor processing apparatus may include a substrate processing chamber having chamber walls defining a chamber interior, the chamber walls having a UV transmissive window. The UV transmissive window has an inside face exposed to the chamber interior, and the inside face of the window is non-reactive with fluorine-containing chemistries. The semiconductor processing apparatus also includes a substrate holder disposed inside the chamber, and a UV source disposed outside the chamber to shine UV radiation into the chamber through the UV transmissive window.

In some such implementations of the semiconductor processing apparatus, the UV transmissive window may include a sapphire pane.

In some further or additional implementations of the semiconductor processing apparatus, the UV transmissive window may be a dual pane window. The dual pane window may include an interior pane exposed to the chamber interior and an exterior pane exposed to the chamber exterior. In some such implementations, the semiconductor processing apparatus may further include a purge gas flow path between the interior and exterior panes of the UV transmissive window. In some such implementations, the semiconductor processing apparatus may further include a purge gas source for delivery of purge gas to the purge gas flow path. In some further such implementations, the interior pane may be mounted in the window such that substantially no stress is imparted to the interior pane by the mounting. In some further such implementations, the interior pane may be made of a first material and the exterior pane may be made of a second material. In some such implementations, the first material may be unreactive with fluorine containing chemistries. In some such implementations, the second material may be unreactive with fluorine containing chemistries. In some such implementations, the first material may be sapphire and the second material may be quartz. In some further such implementations, the second material may be reactive with fluorine containing chemistries. In some such implementations, both the first and second materials may be sapphire. In some such implementations, the purge gas flow path between the two window panes may be maintained at substantially the same pressure as the chamber interior.

In certain implementations, a semiconductor processing system may be provided. The semiconductor processing system may include one or more substrate processing apparatuses. Each substrate processing apparatus may include a substrate processing chamber and a controller for operating the one or more substrate processing chambers. Each substrate processing chamber may include a substrate holder disposed inside the chamber and a UV source disposed outside the chamber to shine UV radiation into the chamber through the UV transmissive window. Each substrate processing chamber may include chamber walls defining a chamber interior, the chamber walls may include a UV transmissive window, the UV transmissive window may have an inside face exposed to the chamber interior such that the inside face of the window is non-reactive with fluorine containing chemistries. The controller, may include instructions to flow a purge gas into the purge gas flow path and flow a first process gas into the chamber interior.

In some such implementations of the semiconductor processing system, the controller may further include instructions to flow the purge gas and the first process gas at the same time. In some such implementations, the controller may further include instructions to maintain the pressure of the purge gas flow path and the chamber interior at substantially the same pressure.

In some further or additional implementations of the semiconductor processing apparatus the controller may further include instructions to flow a second process gas into the purge gas flow path, where the second process gas includes oxygen, and emit UV radiation from the UV source into the purge gas flow path to convert at least some of the oxygen of the second process gas flowed into the purge gas flow path into ozone.

In some further or additional implementations of the semiconductor processing apparatus, the first process gas may include fluorine containing compounds.

In certain implementations, a method of cleaning an ultraviolet semiconductor processing apparatus may be provided. The method may include flowing a first process gas into a substrate processing chamber of the ultraviolet semiconductor processing apparatus, the substrate processing chamber having chamber walls defining a chamber interior, the chamber walls comprising a UV transmissive window, the UV transmissive window is a dual pane window, the dual pane window comprising an interior pane exposed to the chamber interior and non-reactive with fluorine containing chemistries and an exterior pane exposed to the chamber exterior, and flowing a purge gas into a purge gas flow path between the interior and exterior panes of the UV transmissive window.

In some such implementations of the method, the first process gas and the purge gas may be flowed at the same time. In some such implementations, the method may further include exposing the chamber interior to UV radiation emitted by a UV source, the UV radiation generated by the UV source is transmitted through the UV transmissive window into the chamber interior.

In some further or additional implementations of the method, the method may further include maintaining the purge gas flow path between the two window panes at substantially the same pressure as the chamber interior.

In some further or additional implementations of the method, the method may further include flowing a second process gas into the purge gas flow path, the second process gas including oxygen, and emitting UV radiation from the UV source into the purge gas flow path to convert at least some of the oxygen of the second process gas flowed into the purge gas flow path into ozone.

These and other features of the invention will be described in more detail below with reference to the drawings.

BRIEF DESCRIPTION OF THE DRAWINGS

FIGS. 5A, 5B, 5C, and 5D show various implementations of UV transmissive windows.

FIGS. 3, 4A, 4B, and 7 are drawn to-scale within each Figure, although the scale from Figure to Figure may differ.

DETAILED DESCRIPTION

Figure 1:
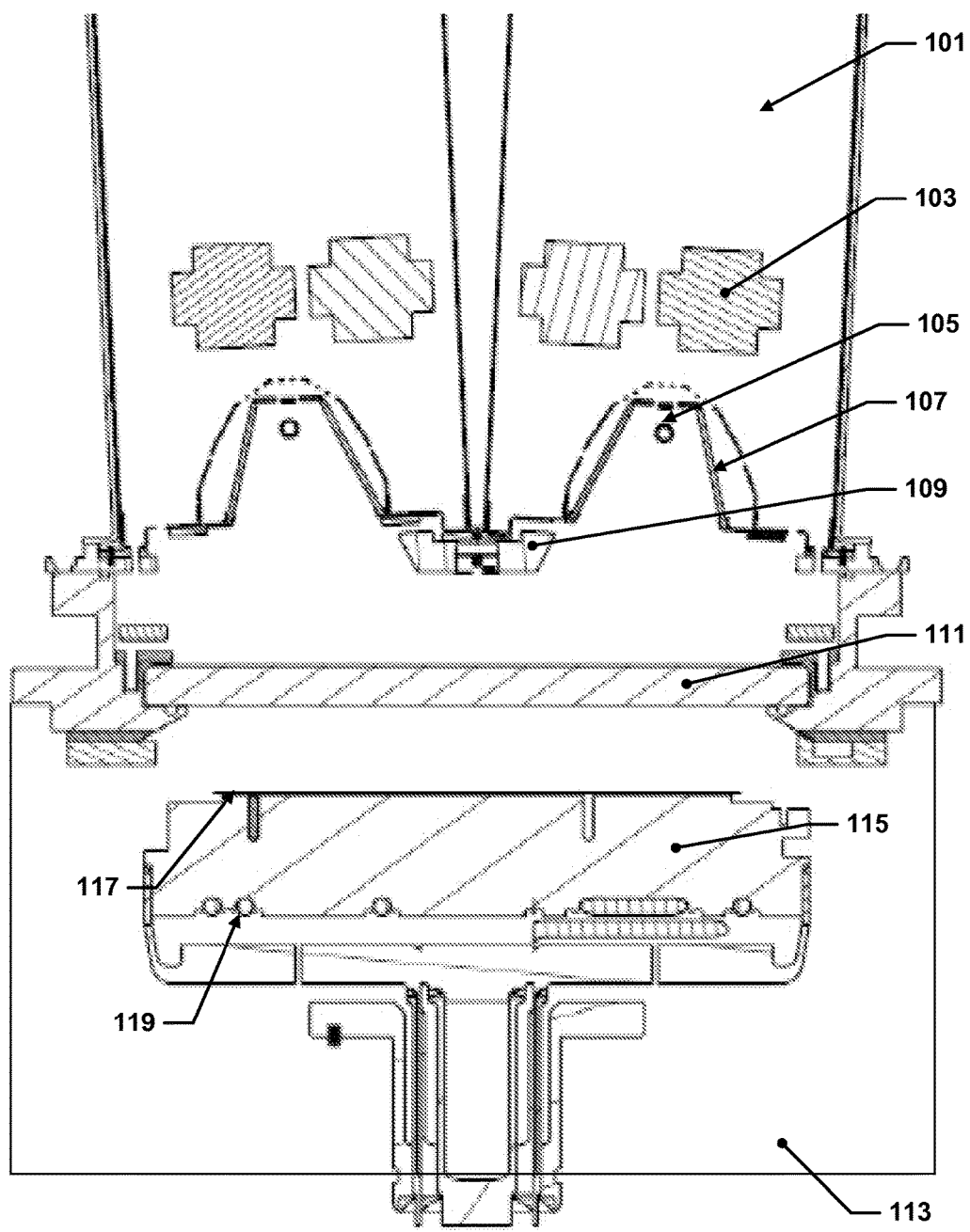
FIG. 1 shows a schematic representation of an example semiconductor processing chamber with a UV radiation source.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

It is to be understood that, as used herein, the term "semiconductor wafer" may refer both to wafers that are made of a semiconductor material, e.g., silicon, and wafers that are made of materials that are not generally identified as semiconductors, e.g., dielectrics and/or conductors, but that typically have semiconductor materials provided on them. Silicon on insulator (SOI) wafers are one such example. The apparatuses and methods described in this disclosure may be used in the processing of semiconductor wafers of multiple sizes, including 200 mm, 300 mm, and 450 mm diameter semiconductor wafers.

Introduction

Semiconductor processing operations may create solid residues deposited on chamber walls and parts within a semiconductor processing chamber. Periodic cleaning of the semiconductor processing chamber may be performed to remove the residue deposits within the semiconductor processing chamber.

Ultraviolet thermal processing (UVTP) chambers have commonly been used for porogen removal operations. Porogen removal results in the production of volatile organic residues that can deposit on chamber walls and parts within the UVTP chamber. A feature of UVTP reactors that distinguishes them from many other semiconductor processing reactors is a UV transmissive window in the chamber walls. UVTP reactor windows are typically made of quartz, since quartz is relatively inexpensive and has well-understood and defined physical characteristics known to be suitable for the application. In particular, quartz windows are known to be able to reliably withstand vacuum-to-ambient pressure differentials across the window. Quartz is also compatible with, namely non-reactive to, oxygen containing removal chemistry for organic residues typical of porogen removal operations.

More recent UVTP processes, such as k-recovery and dielectric repair processes, generate Si-containing residues that require fluorine (F) containing cleaning chemistries. But these fluorine containing chemistries etch conventional quartz glass windows. Therefore, a F-containing cleaning chemistry-resistant window for UVTP reactor is needed in such contexts. One such F-containing cleaning chemistry-resistant window material is sapphire.

This disclosure provides a UVTP reactor with a F-containing cleaning chemistry-resistant window, and methods of its use in UVTP operations and cleaning. A variety of F-containing cleaning chemistry-resistant window implementations are contemplated, including single and dual pane windows, windows with F-containing cleaning chemistry-resistant thin film coatings, dual pane windows with bonded panes and dual pane windows with panes separated by a purge gas flow path. In some implementations, one or more such panes may be made of sapphire or another non-F-reactive material. In certain such implementations, to address concerns about physical properties of sapphire that are not so well understood and about its reliability when subjected to vacuum pressure stresses, a sapphire or other non-F-reactive window may be a pane within the chamber, not subjected to vacuum seal, and a second, outer pane is used to enhance reliability. This second outer pane can also be non-F-reactive (e.g., sapphire). Or the second outer pane can be an F-reactive outer pane with known reliability (e.g., quartz). Such a second outer pane can be used to handle the vacuum stress. This F-reactive outer pane can be protected from F-containing residue depositions by purge gas flow in gap between the panes. Such an outer quartz pane can withstand oxygen-containing cleaning between panes for cleaning of incidental process residue or O-ring off-gassing residue, for example.

F Clean-Resistant UVTP Chambers and Methods

FIG. 1 shows a schematic representation of an example semiconductor processing chamber with a UV radiation source; a UVTP reactor. In FIG. 1, UV lamp assemblies 101 are mounted on top of process chamber 113. Each lamp assembly 101 includes transformers 103 and magnetrons (not shown) that pump microwave energy into the lamp, UV bulb 105, and reflectors 107. As shown, UV detector assembly 109 is mounted between two lamp assemblies 101. A UV transmissive window 111 may transmit UV radiation from the bulbs 105 to a substrate 117 below in the chamber. The substrate 117 sits on a substrate holder 115, that may be heated, cooled or both. As shown, a heater coil 119 is embedded in the substrate support 115.

Figure 2A:
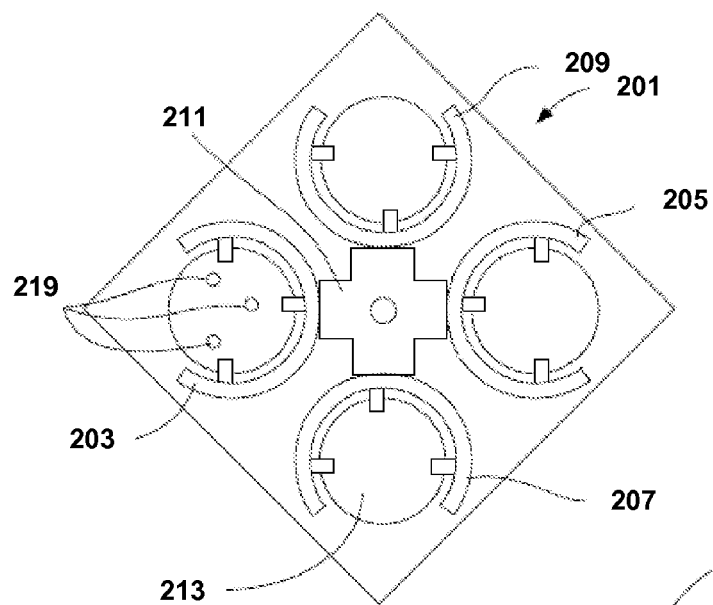
FIGS. 2A and 2B show schematic representations of example multi-station semiconductor processing system with UV radiation sources.
Figure 2B:
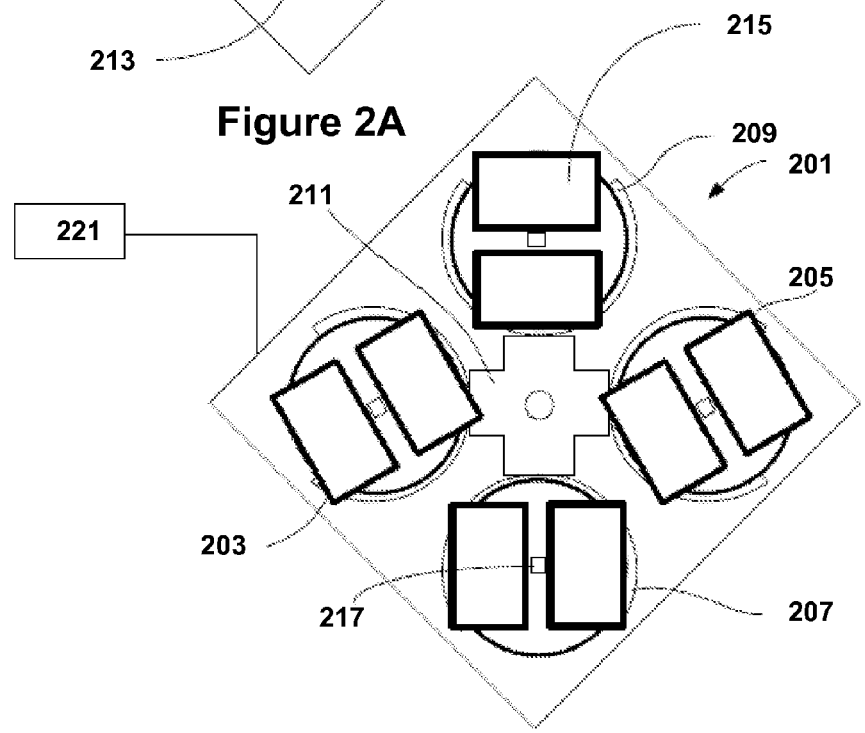

In some implementations, the process chamber may be a part of a multi-station semiconductor processing system. In such implementations, each process chamber may include a substrate holder, one or more chamber windows, and UV lamp assemblies. FIGS. 2A and 2B show schematic representations of example multi-station semiconductor processing system with UV radiation sources.

In FIG. 2A, tool 201 includes four chamber stations, stations 203, 205, 207, and 209. Each station includes a substrate support 213. Embedded in the substrate support 213 are pins 219. Four carrier rings are connected to a spindle 211 that rotates about an axis. When a new substrate is introduced into a chamber, for example, at the station 207, the substrate may be positioned on a robot arm. The carrier ring may lower the substrate to the substrate support, where the substrate may be on top of the pins 219. After substrate processing is complete at one station, the carrier ring may lift the substrate and rotate 90 degrees to the next station, after which the carrier ring may lower the substrate for processing. Thus a substrate may enter the chamber at station 207 and may sequentially move through each of the four stations before exiting the chamber. Additionally, FIG. 2B shows a top view of the same multi-station chamber with UV lamp assemblies 215 on top of each station. A UV detector assembly 217 is positioned about the center between two lamp assemblies.

In certain implementations, a system controller 221 may be employed to control process conditions. Broadly speaking, the controller may be defined as electronics having various integrated circuits, logic, memory, and/or software (stored, for example, in volatile or non-volatile memory) that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed among one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a ultraviolet thermal processing (UVTP) chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller may communicate with one or more other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

For convenience, previous discussion of the UV lamp assembly focused on a two linear bulb configuration for the UV source; however, it is appreciated that this disclosure is not limited to such configurations. For example, any number of bulbs, e.g., 3, 4, or 5, in any kind of configuration, e.g., parallel or end-to-end may be used in the semiconductor apparatus detailed herein.

Figure 3:
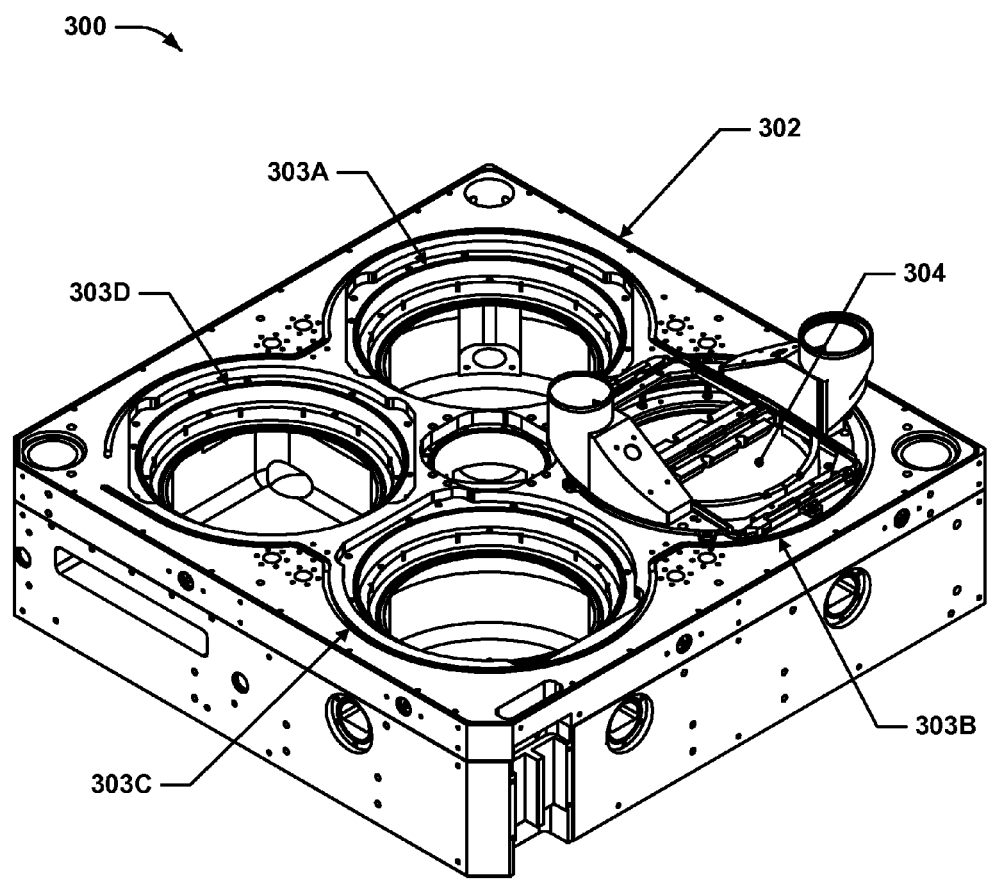
FIG. 3 shows a schematic representation of an example multi-station semiconductor processing system with one populated semiconductor processing chamber that includes a UV radiation source and a UV transmissive window.

FIG. 3 shows a schematic representation of an example multi-station semiconductor processing system with one populated semiconductor processing chamber that includes a UV radiation source and a UV transmissive window. FIG. 3 shows a semiconductor processing system 300 that includes a tool 302 with four semiconductor processing chamber stations 303A-D. Semiconductor processing station 303B is populated with a semiconductor processing chamber 304. The semiconductor processing chamber 304 includes a UV radiation source and a UV transmissive window. For the purposes of this disclosure, "UV transmissive window" refers to a window that allows a substantial amount, such as 50% or greater, of UV radiation with a wavelength of, for example, 200 nm to pass through the pane or panes of the window. Various features of the semiconductor processing chamber are detailed further in other figures in this disclosure.

Figure 4A:
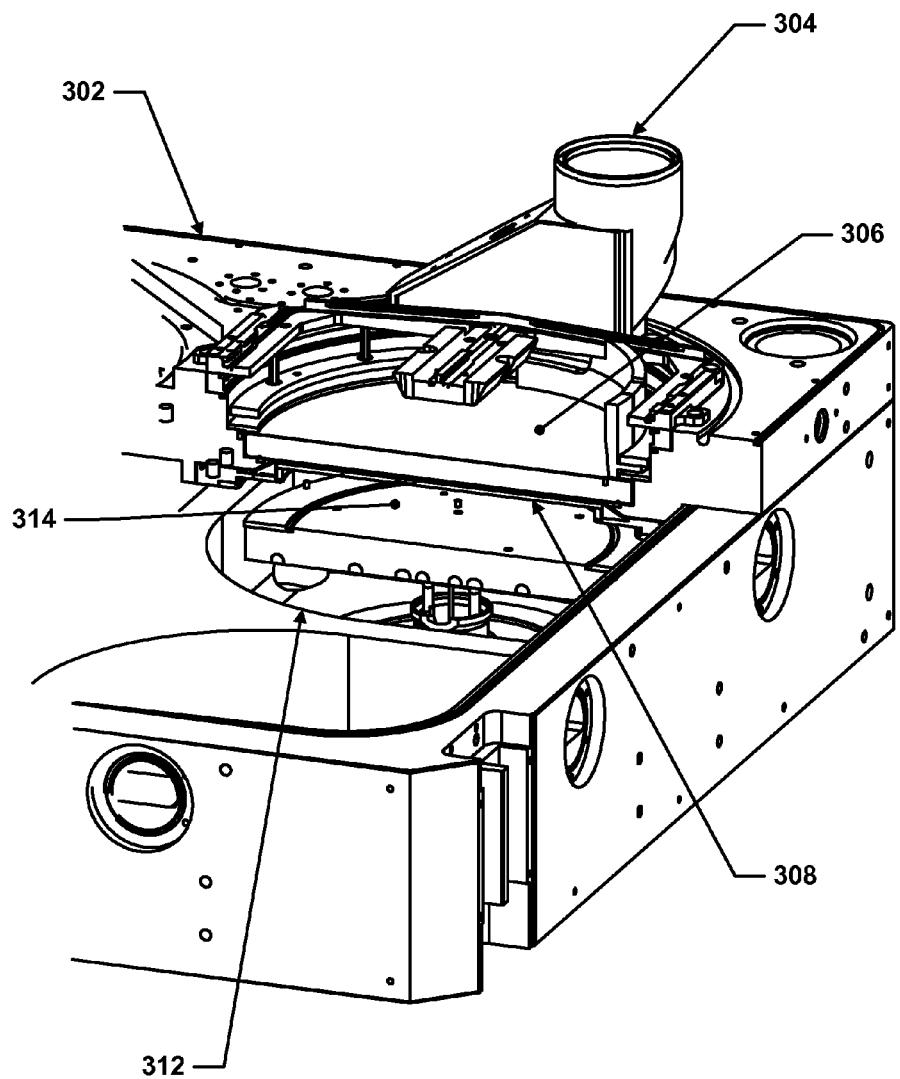
FIG. 4A shows a partial cutaway view of the semiconductor processing chamber of FIG. 3.

FIG. 4A shows a partial cutaway view of the semiconductor processing chamber of FIG. 3. FIG. 4A shows the tool 302 of FIG. 3 with the semiconductor processing chamber 304. The view shown in FIG. 4A is a partial cutaway view, with the top of the tool 302 and the semiconductor processing chamber 304 cut away to show a UV transmissive window, a chamber interior 312, and a substrate holder 314. The UV transmissive window of the semiconductor processing chamber 304 in FIG. 4A is a dual pane window and includes an exterior pane 306 and an interior pane 308. In FIG. 4A, the interior pane 308 of the UV transmissive window is exposed to the chamber interior 312 while the exterior pane 306 is exposed to the exterior of the chamber. In certain implementations, one or more UV sources, such as a UV lamp assemblies, may be located on top of the semiconductor processing chamber 304 and above the exterior pane 306 of the UV transmissive window. The UV source may produce UV radiation that may be transmitted through the UV transmissive window and onto any substrate held by the substrate holder 314.

In certain implementations, the UV transmissive window may be non-reactive with fluorine or fluorine containing chemistries. In the implementation shown in FIG. 4, the interior pane 308 of the UV transmissive window may be non-reactive with fluorine containing chemistries to allow the use of process gases within the chamber interior 312 that may produce fluorine radicals when exposed to UV radiation produced by the UV source. In such implementations, the interior pane 308 may be made from a material or materials that are non-reactive with fluorine containing chemistries such as sapphire, aluminum oxynitride (AlON), and other such materials. In certain such implementations, the material may be single crystal sapphire. In other implementations, the sapphire may be polycrystalline. In other implementations, the interior pane 308 may be coated on one or more sides to be non-reactive with fluorine containing chemistries. In additional implementations, the UV transmissive window may include multiple bonded panes. One or more of the panes bonded together may be non-reactive with fluorine containing chemistries. In certain such implementations, there may not be a purge gas flow path between the bonded panes.

The exterior pane 306 of the UV transmissive window may be, in certain implementations, also made from a material or materials that are non-reactive with fluorine containing chemistries. In other implementations, the exterior pane 306 may be made from windows that are reactive with fluorine containing chemistries, such as quartz. In such implementations, the exterior pane 306 and the interior pane 308 may be separated from each other by a gap and, when the chamber interior 312 is filled with a process gas which may produce fluorine radicals, the gap between the two panes may be filled with a gas, such as a purge gas, that does not produce fluorine radicals to prevent reaction of the exterior pane 306 with fluorine radicals. Additionally, in such implementations, the fluorine reactive material may be coated with a material non-reactive with fluorine.

In certain other implementations, the UV transmissive window may include additional panes, such as three, four, five, or more panes. One or more panes of such UV transmissive windows may be made from a material non-reactive with fluorine containing chemistries, coated with material non-reactive with fluorine containing chemistries, or otherwise be non-reactive with fluorine containing chemistries.

Figure 4B:
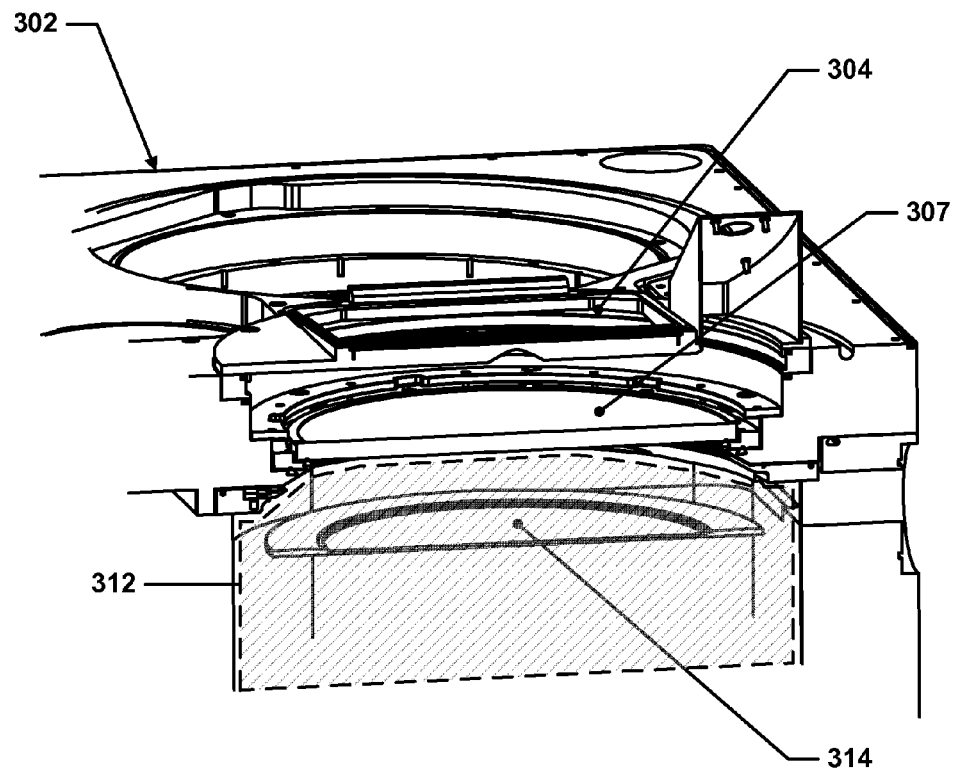
FIG. 4B shows a cutaway view of a semiconductor processing chamber with a UV radiation source and another implementation of a UV transmissive window.

FIG. 4B shows a cutaway view of a semiconductor processing chamber with a UV radiation source and another implementation of a UV transmissive window. The tool 302 shown in FIG. 4B includes the semiconductor processing chamber 304 with the chamber interior 312 and the substrate holder 314 previously detailed in FIG. 4A. However, UV transmissive window 307 in FIG. 4B is a single pane window, in contrast to the dual pane UV transmissive window of FIG. 4A. The single pane window of the UV transmissive window 307 may be made of a material non-reactive with fluorine containing chemistries, coated with material non-reactive with fluorine containing chemistries, or otherwise be non-reactive with fluorine containing chemistries.

Additionally, FIG. 4B further highlights the chamber interior 312. In FIG. 4B, the chamber interior 312 is outlined with broken lines. The chamber interior 312 in FIG. 4B is the portion of the interior of the semiconductor processing chamber 304 that is located below the UV transmissive window. The chamber interior 312 includes the substrate holder 314.

FIGS. 4A and 4B highlight two different configurations of UV transmissive windows. Such different configurations are further described in FIGS. 5A-C. FIGS. 5A, 5B, 5C, and 5D show various implementations of UV transmissive windows.

FIG. 5A shows a UV transmissive window 505A that includes an exterior pane 306A and an interior pane 308. In the implementation shown in FIG. 5A, the exterior pane 306A may be made from a first material while the interior pane 308 may be made from a second material. The second material may be a material that is non-reactive with fluorine containing chemistries, while the first material may be a material that is reactive with fluorine containing chemistries or a material that is non-reactive with fluorine containing chemistries, but different from the second material. In implementations where the first material is reactive with fluorine containing chemistries, the gap between the exterior pane 306A and the interior pane 308 may be a purge gas flow path that may be filled with a purge gas to prevent any process gas that includes a fluorine containing chemistry from contacting the exterior pane 306A during chamber cleaning, or to prevent Si-based residue from depositing within parts of the purge gas flow path, such as on the interior or exterior pane, during substrate processing. Additionally, the exterior pane 306A may be sealed, allowing for the chamber interior and/or the purge gas flow path to be kept at a lower than atmospheric pressure or to be pressurized. In certain implementations, the interior pane 308 may be simply supported instead of pressurized.

FIG. 5B shows a configuration of a two pane UV transmissive window 505B that is similar to the configuration of the UV transmissive window 505A of FIG. 5A. However, the exterior pane 306B of the UV transmissive window 505B is made from the same material that the interior pane 308 is made from. Accordingly, both panes of the UV transmissive window 505B may be non-reactive with fluorine containing chemistries. In such implementations, the purge gas flow path between the exterior and interior panes may not be filled with a purge gas.

FIG. 5C shows a configuration of a single pane UV transmissive window. The single pane UV transmissive window is similar to the single pane UV transmissive window detailed in FIG. 4B. In the implementation shown, the single pane UV transmissive window 307 may be sealed.

FIG. 5D shows a configuration of a two pane UV transmissive window 505D with bonded panes. The UV transmissive window 505D is similar to the single pane UV transmissive window, but instead of a single pane, an exterior pane 306C is bonded to an interior pane 309. The interior pane 309 may be made from a material that is non-reactive with fluorine containing chemistries. In FIG.

5D, the exterior pane 306C is made from a material different from that of the interior pane 309. The exterior pane 306C may be made from a material that is reactive with fluorine containing chemistries, or non-reactive with fluorine containing chemistries. Certain implementations of the multi-bonded pane UV transmissive window may not include a purge gas flow path between the panes.

Figure 6:
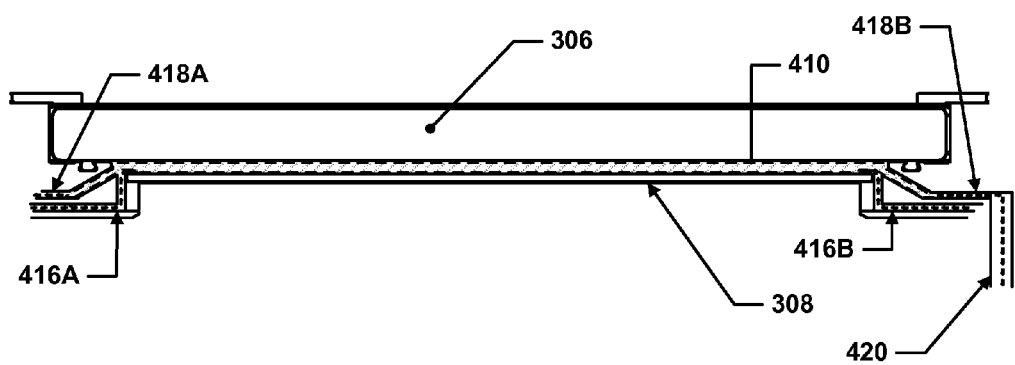
FIG. 6 shows a configuration of a dual pane UV transmissive window with a purge gas flow path.

While a single pane UV transmissive window may not have a purge gas flow path, dual or multi-pane UV transmissive windows may include a purge gas flow path between at least two of the panes. The purge gas flow paths of the UV transmissive windows may include inlets and outlets for purge gas. FIG. 6 shows a configuration of a dual pane UV transmissive window with a purge gas flow path.

FIG. 6 includes an exterior pane 306 and an interior pane 308 of the UV transmissive window. The gap between the two panes of the UV transmissive window forms a purge gas flow path 410. The purge gas flow path 410 may be a plenum volume where a purge gas is flowed into to maintain a pressure to prevent process gas from the chamber interior of the semiconductor processing chamber from contacting the exterior pane 306.

Purge gas may enter the purge gas flow path 410 from inlets 416A and 416B and exit the purge gas flow path 410 from the outlets 418A and 418B. The purge gas from the purge gas flow path 410 may flow out of the purge gas flow path and into the outlets 418A and 418B. The purge gas may leave the semiconductor processing chamber via an exhaust 420 from the outlets 418A and 418B. Various implementations may include only one inlet, outlet, and/or exhaust, or may include multiple inlets, outlets, and/or exhausts, such as 3, 4, 6, 8, or more inlets, outlets, and/or exhausts. In certain implementations, such as implementations with circular UV transmissive windows, the inlet, outlet, or exhaust may be part of or the entire perimeter of the area around at least one pane of the UV transmissive window. Such implementations may allow for more even flow of purge gas into or out of the purge gas flow path, leading to lower stresses on the panes of the UV transmissive window from the flow of the purge gas into and out of the purge gas flow path.

In certain implementations, the interior pane 308 of the UV transmissive window may be made from a material that is non-reactive with fluorine containing chemistries while the exterior pane 306 may be made from a material that is reactive with fluorine containing chemistries. The material of the interior pane 308 may be more expensive than the material of the exterior pane 306. Accordingly, the interior pane 308 may, in certain implementations, be designed to be as thin as possible while still being thick enough to absorb the stresses from semiconductor substrate processing operations or cleaning operations.

Figure 7:
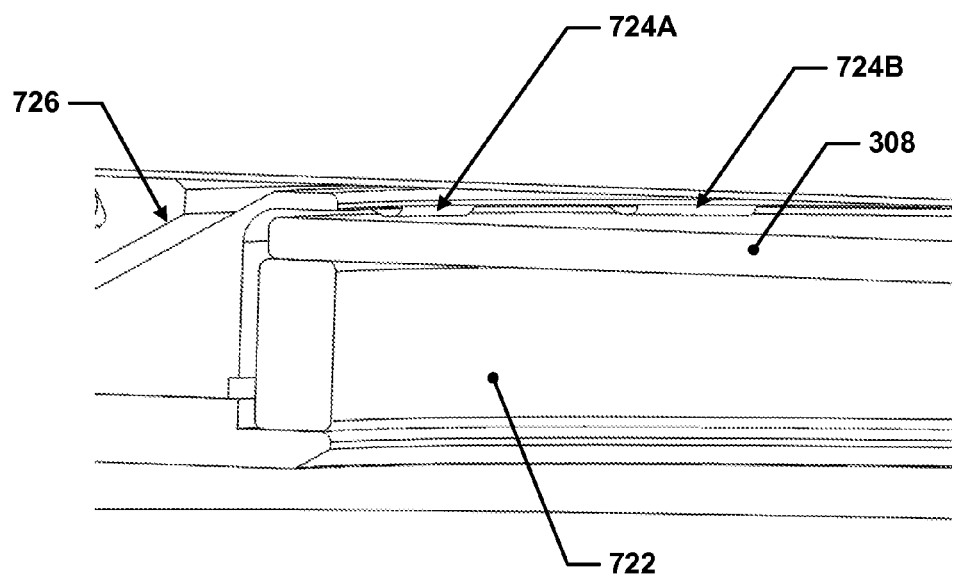
FIG. 7 shows holding features of a pane of a dual pane UV transmissive window.

The stresses on the pane or panes of the UV transmissive window may also be decreased through certain holding features. FIG. 7 shows holding features of a pane of a dual pane UV transmissive window. The interior pane 308 of the UV transmissive window is shown in FIG. 7. The exterior pane 308 is supported by a ring-shaped support piece 722. The support piece 722 simply supports the interior pane 308, decreasing the amount of stress imparted to the interior pane 308. In certain implementations, the interior pane 308 may be allowed to move on the support piece 722, allowing for the interior pane 308 to expand or contract from, for example, temperature differences within the semiconductor processing chamber, without imparting additional stresses to the pane. Holding features 724A and 724B prevent the interior pane 308 from lifting off of the support piece 722. Also visible in FIG. 7 is outlet 726. The outlet 726 stretches around the perimeter of the interior pane 308, allowing for more even flow of purge gas out of the purge gas flow path.

Figure 8A:
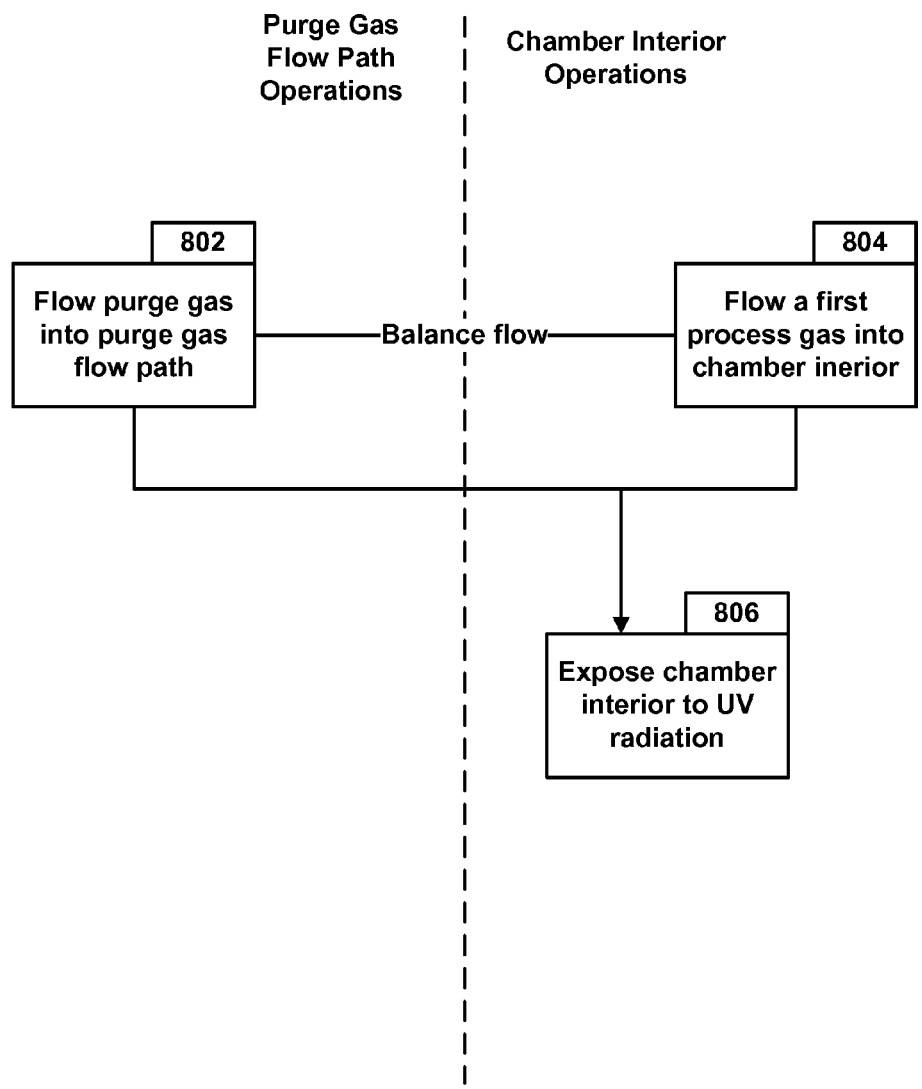
FIGS. 8A and 8B are flowcharts describing cleaning of a semiconductor processing chamber with a UV radiation source and a UV transmissive window.
Figure 8B:
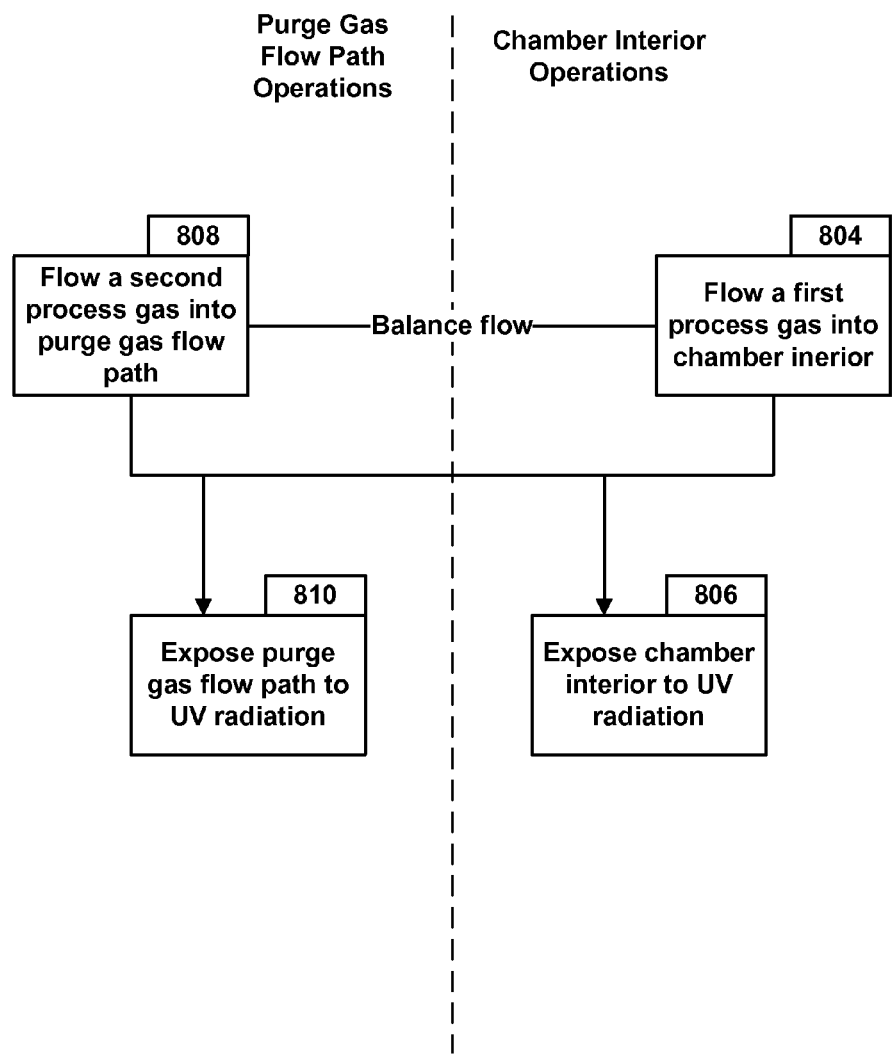

The apparatus and systems previously detailed may be used in semiconductor substrate processing, as well as the cleaning of semiconductor processing chambers. FIGS. 8A and 8B are flowcharts describing cleaning of a semiconductor processing chamber with a UV radiation source and a UV transmissive window.

FIGS. 8A and 8B are divided between operations within the purge gas flow path and operations within the chamber interior. In operation 802 of FIG. 8A, a purge gas is flowed into the purge gas flow path. At substantially the same time, such as within +/−1 seconds, a first process gas is flowed into the chamber interior in operation 804. Certain operations performed by the semiconductor processing tool may pressurize the chamber interior to various pressures such as 1 to 50 torr, up to 160 torr, up to 400 torr, up to 600, or 600 or more torr. In certain implementations, the flow of the purge gas and the first process gas may be balanced such that the pressure within the chamber interior is substantially similar, such as within 10, torr, 50 torr, 100 torr, or 250 torr, to the pressure within the purge gas flow path. Such implementations may flow a volume of up to 0.5, up to 1, up to 2, or 2 or more standard liters per minute (slm) of the first process gas into each chamber interior and a volume of up to 0.5, up to 1, up to 2, or 2 or more slm of the purge gas into each purge gas flow path. Certain implementations may flow a smaller volume of the purge gas as compared to the first process gas due to the smaller volume of the purge gas flow path as compared to the chamber interior. In certain implementations, the purge gas may be continuously flowed through the purge gas flow path while the first process gas is used to pressurize the chamber interior.

Keeping the pressure within the purge gas flow path and the chamber interior substantially similar may decrease the stress experienced by the interior pane of the UV transmissive window from any pressure difference, allowing for a thinner interior window to be used. The pressure within the purge gas flow path and the chamber interior may be balanced through the use of a controller that controls the operations of the semiconductor processing tool.

Semiconductor substrate processing or chamber cleaning operations may involve multiple steps. In such multi-step operations, the pressure of the chamber interior may be different from step to step. The pressure of the purge gas flow path may also need to be changed from step to step to match the change of pressure within the chamber interior. Pressure differentials may develop between the purge gas flow path and the chamber interior due to the differences in the pressure within the purge gas flow path and the chamber interior from differences in the flow of the first process gas into and out of the chamber interior and the flow of the purge gas into and out of the purge gas flow path. In certain implementations, the flow of the purge gas into the purge gas flow path and the flow of the first process gas into the chamber interior may be controlled to prevent any large pressure differential impulses between the chamber interior and the purge gas flow path from creating stresses on the interior pane. In certain such implementations, the changes in pressure of the chamber interior and/or the purge gas flow path may be slowed to prevent additional stressing of the interior pane.

In certain implementations, the thickness of the interior pane and/or the exterior pane may be selected according to the pressures that the pane(s) will experience. In certain such implementations, the thickness of the pane may be determined by using the equation:

$$\frac{d}{L} = \frac{1}{2}\sqrt{\frac{k*f*P}{S}}$$

where d is the thickness of the pane, L is the diameter of the pane for unclamped panes and the diameter of the clamp for clamped panes, k is 0.75 for clamped panes and 1.125 for unclamped panes, f is the safety factor desired, P is the maximum pressure differential between the two sides of the pane, and S is the strength of the window material. Thus, window panes that are large in diameter may need to be thicker for any given pressure differential.

After the first process gas has been flowed into the chamber interior in operation 804 and the purge gas has flowed into the purge gas flow path in operation 802 to prevent the first process gas from reaching the exterior pane of the UV transmissive window, operation 806 is performed. In operation 806, UV radiation is produced by a UV source. The UV radiation is transmitted through the UV transmissive window into the chamber interior. The UV radiation may produce reactions in the first process gas. In certain implementations, the reactions produced may include the creation of fluorine radicals.

FIG. 8B details a similar cleaning process to that of FIG. 8A. However, operation 802 of FIG. 8A is replaced with operation 808 in FIG. 8B. In operation 808, a second process gas, instead of a purge gas, is flowed into the purge gas flow path. The second process gas may include oxygen. After the second process gas and the first process gas have been flowed in operations 808 and 804, the UV radiation from the UV source may then be transmitted into the purge gas flow path in operation 810 and the chamber interior in operation 806. The UV radiation may convert at least a portion of the oxygen within the second process gas into ozone. The ozone may clean organic residues deposited on portions of the purge gas flow path.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. A semiconductor processing apparatus, comprising:
   a substrate processing chamber having chamber walls defining a chamber interior, the chamber walls comprising a UV transmissive window, wherein:
   the UV transmissive window is a dual pane window that comprises an interior pane exposed to the chamber interior and an exterior pane exposed to an exterior of the substrate processing chamber,
   the interior pane is comprised of a first material that is non-reactive with fluorine-containing chemistries, and
   the exterior pane is comprised of a second material that is reactive with fluorine-containing chemistries;
   a substrate holder disposed inside the chamber interior;
   a UV source disposed outside the chamber interior to shine UV radiation into the chamber interior through the UV transmissive window; and
   a purge gas flow path that is between the interior pane and the exterior pane of the UV transmissive window and that includes an inlet and an outlet, wherein the interior pane is offset from the exterior pane in a first direction, wherein the inlet is positioned radially outward of the interior pane and is radially interposed between the interior pane and the outlet, and wherein the outlet is positioned radially outward of the inlet.

2. The semiconductor processing apparatus of claim 1, wherein the first material is sapphire.

3. The semiconductor processing apparatus of claim 1, further comprising a purge gas source for delivery of purge gas to the purge gas flow path.

4. The semiconductor processing apparatus of claim 1, wherein the interior pane is mounted in the UV transmissive window such that substantially no stress is imparted to the interior pane by the mounting.

5. The semiconductor processing apparatus of claim 4, further comprising a support piece that supports the interior pane.

6. The semiconductor processing apparatus of claim 5, wherein the support piece is ring-shaped.

7. The semiconductor processing apparatus of claim 5, wherein the support piece is configured to allow the interior pane to move on the support piece.

8. The semiconductor processing apparatus of claim 5, further comprising holding features, wherein the holding features are positioned on the interior pane and configured to prevent the interior pane from separating from the support piece.

9. The semiconductor processing apparatus of claim 1, wherein:
   the interior pane has a first diameter, and
   the exterior pane has a second diameter that is larger than the first diameter.

10. The semiconductor processing apparatus of claim 1, wherein:
    the interior pane has a first thickness, and
    the exterior pane has a second thickness that is larger than the first thickness.

11. The semiconductor processing apparatus of claim 1, wherein the second material is quartz.

12. The semiconductor processing apparatus of claim 1, wherein the first material is sapphire and the second material is quartz.

13. The semiconductor processing apparatus of claim 1, wherein the purge gas flow path between the two window panes is maintained at substantially the same pressure as the chamber interior.

14. A semiconductor processing system comprising:
one or more substrate processing apparatuses, each substrate processing apparatus including a substrate processing chamber, wherein each substrate processing chamber includes:
chamber walls defining a chamber interior, the chamber walls comprising a UV transmissive window, wherein:
the UV transmissive window is a dual pane window that comprises an interior pane exposed to the chamber interior and an exterior pane exposed to an exterior of the substrate processing chamber,
the interior pane is comprised of a first material that is non-reactive with fluorine containing chemistries, and
the exterior pane is comprised of a second material that is reactive with fluorine-containing chemistries;
a substrate holder disposed inside the chamber interior, and
a UV source disposed outside the chamber interior to shine UV radiation into the substrate processing chamber through the UV transmissive window;
a purge gas flow path that is between the interior pane and the exterior pane of the UV transmissive window and that includes an inlet and an outlet, wherein the interior pane is offset from the exterior pane in a first direction, wherein the inlet is positioned radially outward of the interior pane and is radially interposed between the interior pane and the outlet, and wherein the outlet is positioned radially outward of the inlet; and
a controller for operating the one or more substrate processing apparatuses, the controller comprising instructions to:
flow a purge gas into the purge gas flow path, and
flow a first process gas into the chamber interior.

15. The semiconductor processing system of claim 14, wherein the controller further comprises instructions to flow the purge gas and the first process gas at the same time.

16. The semiconductor processing system of claim 15, wherein the controller further comprises instructions to maintain the pressure of the purge gas flow path and the chamber interior at substantially the same pressure.

17. The semiconductor processing system of claim 14, wherein the controller further comprises instructions to:
flow a second process gas into the purge gas flow path, wherein the second process gas includes oxygen; and
emit UV radiation from the UV source into the purge gas flow path to convert at least some of the oxygen of the second process gas flowed into the purge gas flow path into ozone.

18. The semiconductor processing system of claim 14, wherein the first process gas includes fluorine containing compounds.

19. The semiconductor processing system of claim 14, further comprising two or more substrate processing apparatuses.

20. The semiconductor processing system of claim 19, further comprising four substrate processing apparatuses.

* * * * *